US011689195B2

(12) United States Patent
Yonehara et al.

(10) Patent No.: US 11,689,195 B2
(45) Date of Patent: Jun. 27, 2023

(54) SEMICONDUCTOR DEVICE

(71) Applicants:Kabushiki Kaisha Toshiba, Tokyo (JP); Toshiba Electronic Devices & Storage Corporation, Tokyo (JP)

(72) Inventors: Naoya Yonehara, Kawasaki Kanagawa (JP); Shuji Toda, Kawasaki Kanagawa (JP); Masatoshi Watanabe, Kawasaki Kanagawa (JP); Takaaki Kakumu, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/677,775

(22) Filed: Feb. 22, 2022

(65) Prior Publication Data

US 2023/0033656 A1 Feb. 2, 2023

(30) Foreign Application Priority Data

Jul. 28, 2021 (JP) .............................. JP2021-123097

(51) Int. Cl.
*H03K 17/0812* (2006.01)
(52) U.S. Cl.
CPC .............................. *H03K 17/08122* (2013.01)

(58) Field of Classification Search
CPC ................................................ H03K 17/08122
See application file for complete search history.

(56) References Cited

U.S. PATENT DOCUMENTS

| 7,031,129 | B2 | 4/2006 | Mayama et al. |
| 7,606,015 | B2 | 10/2009 | Tanabe |
| 8,547,142 | B2 | 10/2013 | Nakahara et al. |
| 9,871,513 | B2 | 1/2018 | Iwamizu et al. |
| 10,720,922 | B1 * | 7/2020 | Chisaka ............... H03K 17/145 |

FOREIGN PATENT DOCUMENTS

| JP | H06-061826 A | 3/1994 |
| JP | 2004-247588 A | 9/2004 |
| JP | 2008-172940 A | 7/2008 |
| JP | 2012-109937 A | 6/2012 |
| JP | 2017-005862 A | 1/2017 |

* cited by examiner

*Primary Examiner* — Metasebia T Retebo
(74) *Attorney, Agent, or Firm* — Allen & Overy LLP

(57) ABSTRACT

In general, according to one embodiment, a semiconductor device includes a first terminal, a second terminal and a first circuit. The first circuit includes a first switching element, a second switching element and a first resistor. The gate of the first switching element is coupled between the first node and the second terminal. The first resistor and the second switching element are coupled in series between the first node and the second terminal. The first circuit is configured to change the first switching element and the second switching element from an off state to an on state when supply of the first voltage to the first node is stopped.

8 Claims, 6 Drawing Sheets

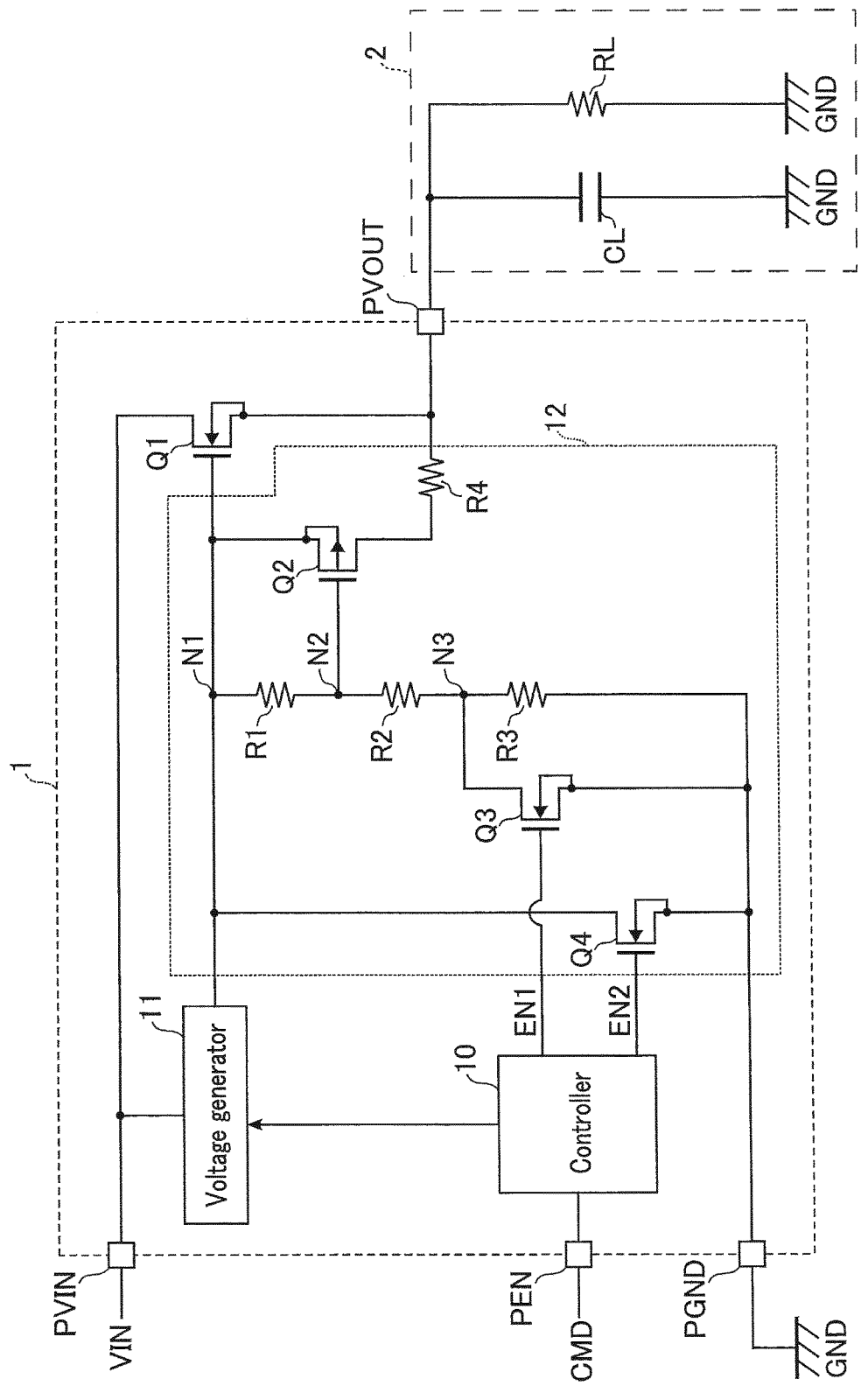
F I G. 1

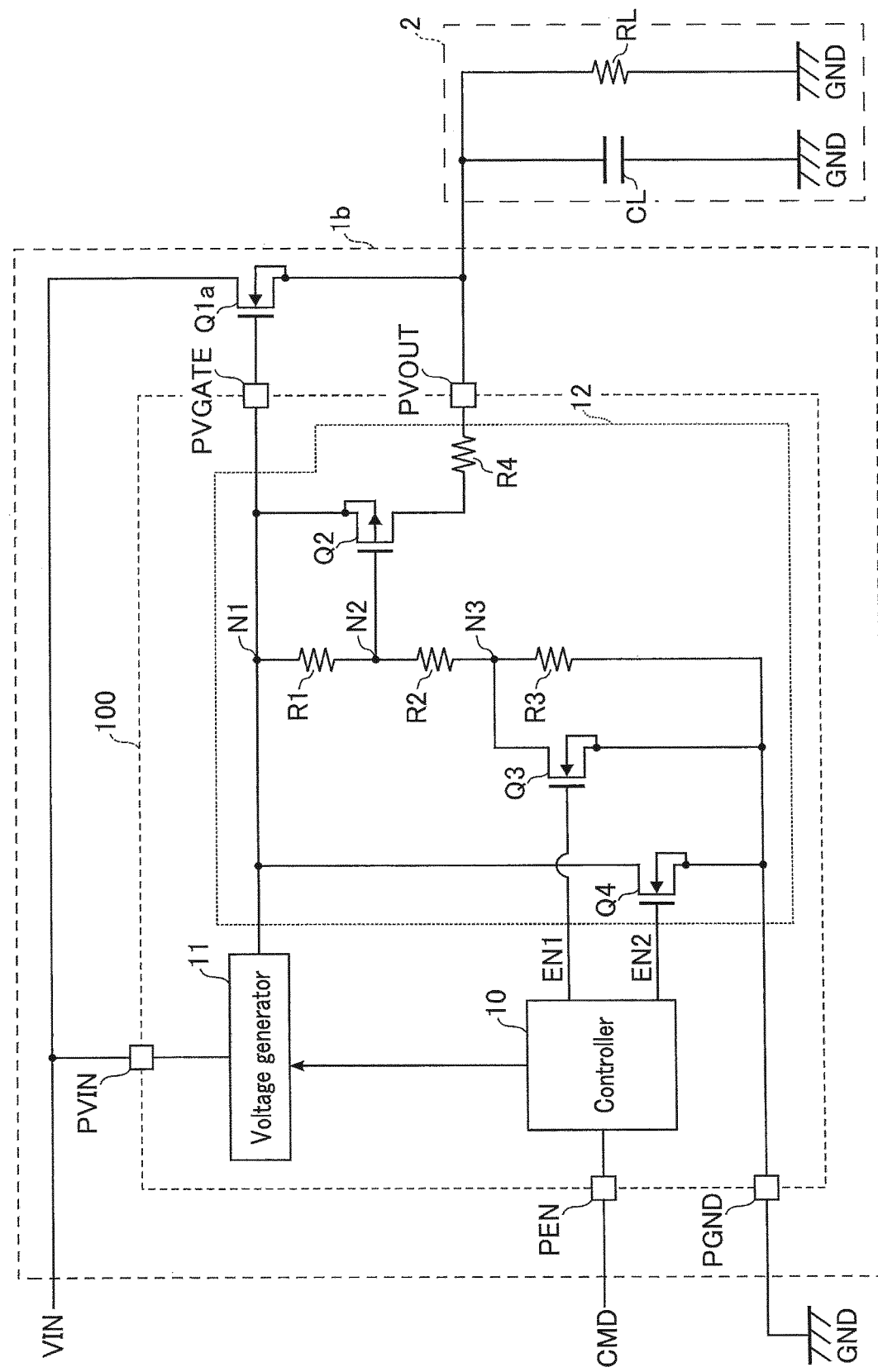
F I G. 6

SEMICONDUCTOR DEVICE

CROSS-REFERENCE TO RELATED APPLICATIONS

This application is based upon and claims the benefit of priority from Japanese Patent Application No. 2021-123097, filed Jul. 28, 2021, the entire contents of which are incorporated herein by reference.

FIELD

Embodiments described herein relate generally to a semiconductor device.

BACKGROUND

A semiconductor device for supplying electric power to a load is known.

BRIEF DESCRIPTION OF THE DRAWINGS

FIG. 1 is a circuit diagram for illustrating a configuration example of a semiconductor device according to the first embodiment and a configuration example of a load to which electric power is supplied by the semiconductor device.

FIG. 6 is a circuit diagram for illustrating a configuration example of a semiconductor device according to a modification and a configuration example of a load to which electric power is supplied by the semiconductor device.

DETAILED DESCRIPTION

Figure 2:
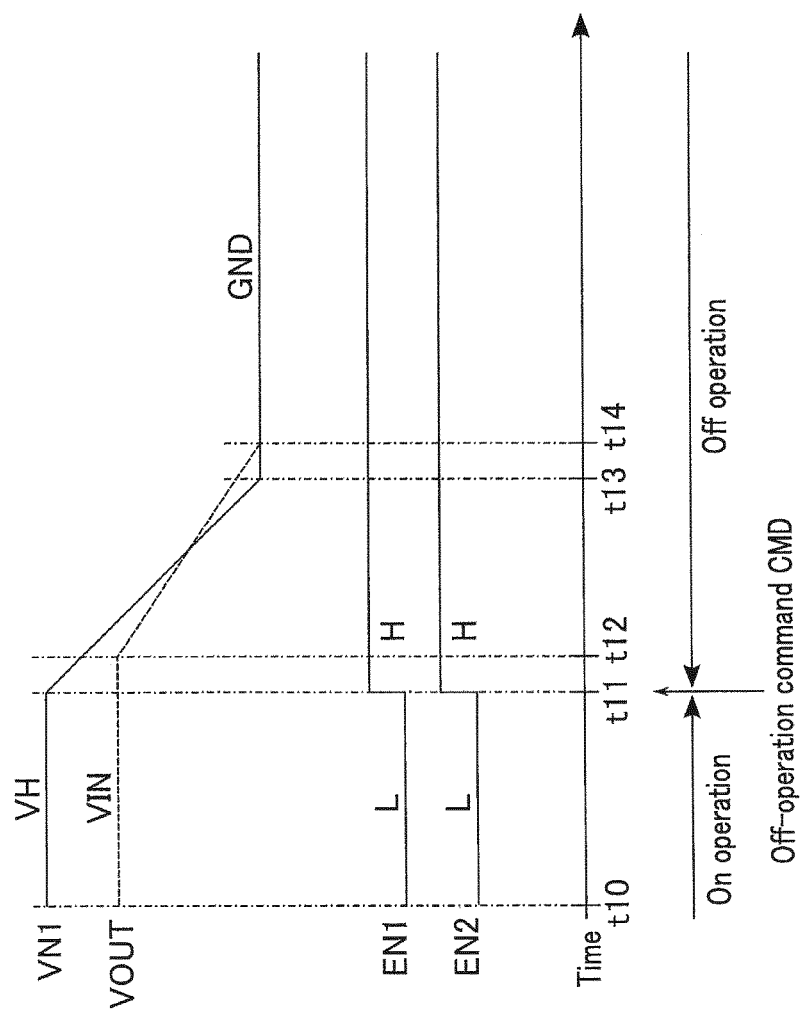
FIG. 2 is a timing chart showing an operation example of the semiconductor device of the first embodiment.

In general, according to one embodiment, a semiconductor device includes a first terminal, a second terminal and a first circuit. The first circuit includes a first switching element, a second switching element and a first resistor. The first switching element includes a first end, a second end and a gate. The first end of the first switching element is coupled to a first node to which a first voltage is supplied. The second end of the first switching element is coupled to the first terminal. The gate of the first switching element is coupled between the first node and the second terminal. The first resistor and the second switching element are coupled in series between the first node and the second terminal. The first circuit is configured to change the first switching element and the second switching element from an off state to an on state when supply of the first voltage to the first node is stopped.

A description will now be given of the embodiments with reference to the accompanying drawings. In the description below, the structural elements having the same functions and configurations will be denoted by the same reference symbols. The embodiments shown below exemplify technical ideas. The embodiments do not specify the materials, shapes, structures, arrangements, etc. of the structural components. The embodiments can be modified in various ways.

[1] First Embodiment

A semiconductor device according to the first embodiment will be described.
[1-1] Configuration
[1-1-1] Overall Configuration of Semiconductor Device FIG. 1 is a circuit diagram for illustrating a configuration example of a semiconductor device according to the first embodiment and a configuration example of a load to which electric power is supplied by the semiconductor device. The semiconductor device 1 is a load switch that enables electric power to be supplied to the load 2. The semiconductor device 1 is, for example, an IC (Integrated Circuit) chip. The load 2 is a circuit that performs various operations using the electric power supplied from the semiconductor device 1. The load 2 is, for example, an IC chip.

The semiconductor device 1 includes terminals PVIN, PVOUT, PEN and PGND, a switching element Q1, a controller 10, a voltage generator 11, and a switching circuit 12.

The terminal PVIN is a power source terminal of the semiconductor device 1. A voltage VIN is applied to the terminal PVIN from the outside of the semiconductor device 1.

The terminal PVOUT is an output terminal of the semiconductor device 1. Electric power is supplied from the terminal PVOUT to the outside of the semiconductor device 1.

The terminal PEN is a control terminal of the semiconductor device 1. Commands CMD are input to the terminal PEN from the outside of the semiconductor device 1. The commands CMD include a command CMD for causing the semiconductor device 1 to drive the load 2 and a command CMD for causing the semiconductor device 1 to stop driving the load 2. In the description below, the operation of causing the semiconductor device 1 to drive the load 2 will be referred to as an "on operation" as well. The operation of causing the semiconductor device 1 to stop driving the load 2 will be referred to as an "off operation" as well. The command for causing the semiconductor device 1 to, drive the load 2 will be referred to as an "on-operation command CMD" as well. The command for causing the semiconductor device 1 to stop driving the load 2 will be referred to as an "off-operation command CMD" as well.

The terminal PGND is a ground terminal of the semiconductor device 1. The terminal PGND is grounded.

The switching element Q1 is an N-channel MOSFET. The voltage VIN is applied to the drain of the switching element Q1 via the terminal PVIN. The source of the switching element Q1 is coupled to the terminal PVOUT. The gate of the switching element Q1 is coupled to the node N1. The switching element Q1 outputs the voltage VIN to the load 2 via the terminal PVOUT when the switching element Q1 is in the on state. It should be noted that the voltage Ron(Q1)× IOUT, which can be expressed by the mathematical product of the on-resistance Ron(Q1) of the switching element Q1 and the current IOUT flowing through the switching element Q1 in the on state, is set to a very small and negligible level. When the switching element Q1 is in the off state, it does not output the voltage VIN to the load 2 via the terminal PVOUT.

The controller 10 controls the overall operation of the semiconductor device 1. The controller 10 receives a command CMD from the outside of the semiconductor device 1 via the terminal PEN. The controller 10 controls the operations of the voltage generator 11 and the switching circuit 12, based on the received command CMD. The controller 10 outputs signals EN1 and EN2 to the switching circuit 12.

The voltage generator 11 is, for example, a charge pump. The voltage VIN is input to the voltage generator 11 via the terminal PVIN. The voltage generator 11 generates a voltage higher than the voltage VIN, based on the control of the controller 10. The voltage generated by the voltage generator 11 is supplied to the node N1.

The switching circuit 12 controls the on/off operation of the switching element Q1. The switching circuit 12 turns off the switching element Q1, based, on the signals EN1 and EN2 received from the controller 10.

The load 2 includes a capacity load CL and a resistance load RL. The capacity load CL stores electric power supplied thereto. The resistance load RL consumes the power supplied thereto. The capacity load CL is provided between the terminal PVOUT and the ground voltage. The resistance load RL is provided between the terminal PVOUT and the ground voltage in parallel with the capacity load CL.

[1-1-2] Configuration of Switching Circuit 12

Details of the switching circuit 12 will be described. The switching circuit 12 includes resistance elements R1 to R4 and switching elements Q2 to Q4. The switching element Q2 is a P-channel MOSFET. The switching elements Q3 and Q4 are N-channel MOSFETs.

The resistance elements R1 to R3 are coupled in series between the node N1 and the terminal PGND in the order of the resistance element R1, the resistance element R2 and the resistance element R3. Specifically, one end of the resistance element R1 is coupled to the node N1. The other end of the resistance element R1 is coupled to the node N2. One end of the resistance element R2 is coupled to the node N2. The other end of the resistance element R2 is coupled to the node N3. One end of the resistance element R3 is coupled to the node N3. The other end of the resistance element R3 is coupled to the terminal PGND.

One end of the resistance element R4 is coupled to the terminal PVOUT.

The source of the switching element Q2 is coupled to the node N1. The gate of the switching element Q2 is coupled to the node N2. The drain of the switching element Q2 is coupled to the other end of the resistance element R4. In other words, the drain of the switching element Q2 is coupled to the terminal PVOUT via the resistance element R4.

The source of the switching element Q3 is coupled to the terminal PGND. The drain of the switching element Q3 is coupled to the node N3. The gate of the switching element Q3 is supplied with the signal EN1. The switching element Q3 is turned on based on the H level signal EN1, and is turned off based on the L level signal EN1.

The source of the switching element Q4 is coupled to the terminal PGND. The drain of the switching element Q4 is coupled to the node N1. The gate of the switching element Q4 is supplied with the signal EN2. The switching element Q4 is turned on based on the H level signal EN2, and is turned off based on the L level signal EN2.

Although not shown, each of the switching elements Q1 to Q4 includes a body diode. Specifically, each of the switching elements Q1, Q3 and Q4, which are N-channel MOSFETs, includes a body diode whose anode is coupled to the source and whose cathode is coupled to the drain. The switching element Q2, which is a P-channel MOSFET, includes a body diode whose anode is coupled to the drain and whose cathode is coupled to the source.

The resistance value of each of the resistance elements R1 to R3 is larger than the resistance value of the resistance element R4. Specifically, for example, the resistance value of each of the resistance elements R1 to R3 is several hundred k$\Omega$ to several M$\Omega$, and the resistance value of the resistance element R4 is several k$\Omega$. The resistance values of the resistance elements R1 to R3 will be referred to as resistance values r1 to r3, respectively. The threshold voltage of the switching element Q2 will be referred tows Vth(Q2). The voltage which the voltage generator 11 outputs to the node N1 will be referred to as a voltage VH. The resistance values r1 to r3 are determined to satisfy the following formulas (1) and (2)

$$|VH \times (r1)/(r1+r2+r3)| < |Vth(Q2)| \tag{1}$$

$$|VH \times (r1)/(r1+r2)| > |Vth(Q2)| \tag{2}$$

[1-2] Operation

A description will now be given of how the semiconductor device 1 operates. In the description below, the voltage of the node N1 will be referred to as "VN1". The voltage of the terminal PVOUT will be referred to as "VOUT". The ground voltage GND is 0V.

FIG. 2 is a timing chart showing an operation example of the semiconductor device of the first embodiment.

FIG. 2 shows how the semiconductor device 1 executing the on operation executes the off operation in response to the reception of an off-operation command CMD. FIG. 2 shows a voltage VN1, a voltage VOUT, a signal EN1 and a signal EN2. The voltage VN1 is shown by a solid line and the voltage VOUT is shown by a broken line. The signals EN1 and EN2 are shown by solid lines.

At time t10, the semiconductor device 1 is executing the on operation. In the on operation, the controller 10 causes the voltage generator 11 to output the voltage VH.

Thus, the voltage VN1 is the voltage VH. The voltage VH is a voltage higher than the sum of the threshold voltage of the switching element Q1 and the voltage VIN. Based on the voltage VH, the switching element Q1 is turned on. The switching element Q1 in the on state supplies the voltage VIN to the load 2 via the terminal PVOUT. Thus, the voltage VOUT becomes equal to the voltage VIN.

The controller 10 outputs the L level signal EN1 and the L level signal EN2 to the switching circuit 12. Thus, the switching elements Q3 and Q4 are turned off.

Since the switching element Q3 is in the off state, the voltage of the node N2 takes a value obtained by dividing the voltage VH by the resistance elements R1 to R3 coupled in series. The magnitude of the gate-source voltage VGS (Q2) of the switching element Q2 can be expressed by the following formula (3):

$$|VGS(Q2)| = |VH \times (r1)/(r1+r2+3)| \tag{3}$$

The resistance values r1 to r3 of the resistance elements R1 to R3 are determined to satisfy the above-mentioned formula (1). Therefore, the magnitude of the gate-source voltage VGS(Q2) is smaller than the magnitude of the threshold voltage Vth(Q2) of the switching element Q2. Therefore, the switching element Q2 is turned off.

As described above, in the semiconductor device 1 executing the on operation, the switching element Q1 is in the on state and the switching elements Q2 to Q4 are in the off state. The switching element Q1 in the on state supplies electric power to the load 2.

At time t11, the semiconductor device 1 executes the off operation in response to the reception of the off-operation command CMD. Specifically, when the controller 10 receives the off-operation command CMD, the controller 10 causes the voltage generator 11 to stop outputting the voltage VH. Further, the controller 10 outputs the H level signal EN1 and the H level signal EN2 to the switching circuit 12. In the switching circuit 12, the switching element Q3 is turned on based on the H level signal EN1.

As a result, the voltage of the node N2 takes a value obtained by dividing the voltage VH by the resistance elements R1 and R2 because the switching element Q3 in the on state short-circuits the resistance element R3. The magnitude of the gate-source voltage VGS(Q2) of the switching element Q2 can be expressed by the following formula (4):

$$|VGS(Q2)|=|VH\times(r1)/(r1+r2)|  \quad (4)$$

The resistance value r1 of the resistance element R1 and the resistance value r2 of the resistance element R2 are defined to satisfy the above-mentioned formula (2).

Therefore, the magnitude of the gate-source voltage VGS (Q2) is larger than the magnitude of the threshold voltage Vth(Q2) of the switching element Q2. Thus, the switching element Q2 is turned on.

As a result, the node N1 and the terminal PVOUT are coupled via the switching element Q2 in the on state and the resistance element R4. Thus, the voltage VN1 is discharged via the switching element Q2 in the on state and the resistance element R4 such that the magnitude of the gate-source voltage VGS(Q1) of the switching element Q1 decreases.

In the switching circuit 12, the switching element Q4 is turned on based on the H level signal EN2. As a result, the node Ni and the terminal PGND are short-circuited by the switching element Q4 in the on state. Thus, the voltage VN1 is discharged via the switching element Q4 in the on state.

In this manner, the discharge of the voltage VN1 is started at time t11, and the voltage VN1 decreases from the voltage VH.

Since the voltage VN1 lowers at time t12, the magnitude of the gate-source voltage VGS(Q1) of the switching element Q1 becomes smaller than the magnitude of the threshold voltage Vth(Q1) of the switching element Q1, and the switching element Q1 is turned off. The switching element Q1 in the off state does not supply electric power to the load 2.

In the load 2 to which electric power is not supplied, the electric charge stored in the capacity load CL is consumed by the resistance load RL. After time t12, therefore, the voltage VOUT drops to 0V.

When the voltage VN1 decreases and the magnitude of the gate-source voltage VGS(Q2) of the switching element Q2 becomes less than the threshold voltage Vth(Q2) of the switching element Q2, the switching element Q2 is turned off. On the other hand, the switching element Q4 maintains the on state even after the voltage VN1 drops. Thus, the voltage VN1 drops to 0V.

At time t13, the voltage VN1 is 0V. In the example shown in FIG. 2, the voltage VN1 drops to 0V before the voltage VOUT does, so that the gate-source voltage VGS(Q1) of the switching element Q1 is 0V or less at time t13.

At time t14, the voltage VOUT is 0V. At time t14, the gate-source voltage VGS(Q1) of the switching element Q1 is 0V.

In this manner, the semiconductor device 1 that has received the off-operation command CMD executes the off operation, and the switching elements Q2 to Q4 are turned on and the voltage VN1 is lowered to set the switching element Q1 to the off state. The switching element Q1 in the off state stops the supply of electric power to the load 2. The voltage VN1 decreases to 0V by the switching element Q4 in the on state, and the gate-source voltage VGS(Q1) of the switching element Q1 becomes 0V or lower than that.

[1-3] Advantages

According to the semiconductor device 1 of the first embodiment described above, the unintended supply of electric power in the off operation can be suppressed.

Detailed advantages of the semiconductor device 1 of the first embodiment will be described below.

The semiconductor device 1 of the first embodiment includes a switching element Q2 and a switching element Q4. The source of the switching element Q2 is coupled to the node N1 to which the voltage VH is supplied. The drain of the switching element Q2 is coupled to the terminal PVOUT via the resistance element R4. The gate of the switching element Q2 is coupled to the node N2, which is a connection node of the resistance elements R1 to R3 coupled in series between the node N1 and the terminal PGND. In other words, the gate of the switching element Q2 is coupled between the node Ni and the terminal PGND. The source of the switching element Q4 is coupled to the terminal PGND. The drain of the switching element Q4 is coupled to the node N1. When the supply of the voltage VH to the node N1 is stopped, the switching element Q2 and the switching element Q4 change from the off state to the on state.

With this configuration, the semiconductor device 1 of the first embodiment can decrease the voltage VN1 of the node N1 to 0V in a short time at the time of switching from the on operation to the off operation. Specifically, when the off operation is started, the switching elements Q2 and Q4 are turned on, so that the voltage VN1 is discharged. When the voltage VN1 lowers, the switching element Q2 transitions to the off state. However, the switching element Q4 maintains the on state, and the voltage VN1 is discharged to 0V. Therefore, when the semiconductor device 1 of the first embodiment is switched from the on operation to the off operation, the voltage VN1 can be discharged to 0V without lingering at any halfway voltage. In the semiconductor device 1 of the first embodiment, therefore, the gate-source voltage VGS(Q1) of the switching element Q1 can be reduced to 0V or lower in a short time when the semiconductor device 1 is switched from the on operation to the off operation.

Thus, the semiconductor device 1 of the first embodiment prevents the switching element Q1 from unintentionally transitioning to the on state during the off operation, and can therefore suppress unintended supply of electric power.

[2] Second Embodiment

The semiconductor device, of the second embodiment differs from the semiconductor device of the first embodiment in terms of the configuration of the switching circuit and the operation of the controller. A description will be given of the points in which the semiconductor device 1a of the second embodiment differs from that of the first embodiment.

[2-1] Configuration
[2-1-1] Configuration of Semiconductor Device 1a

Figure 3:
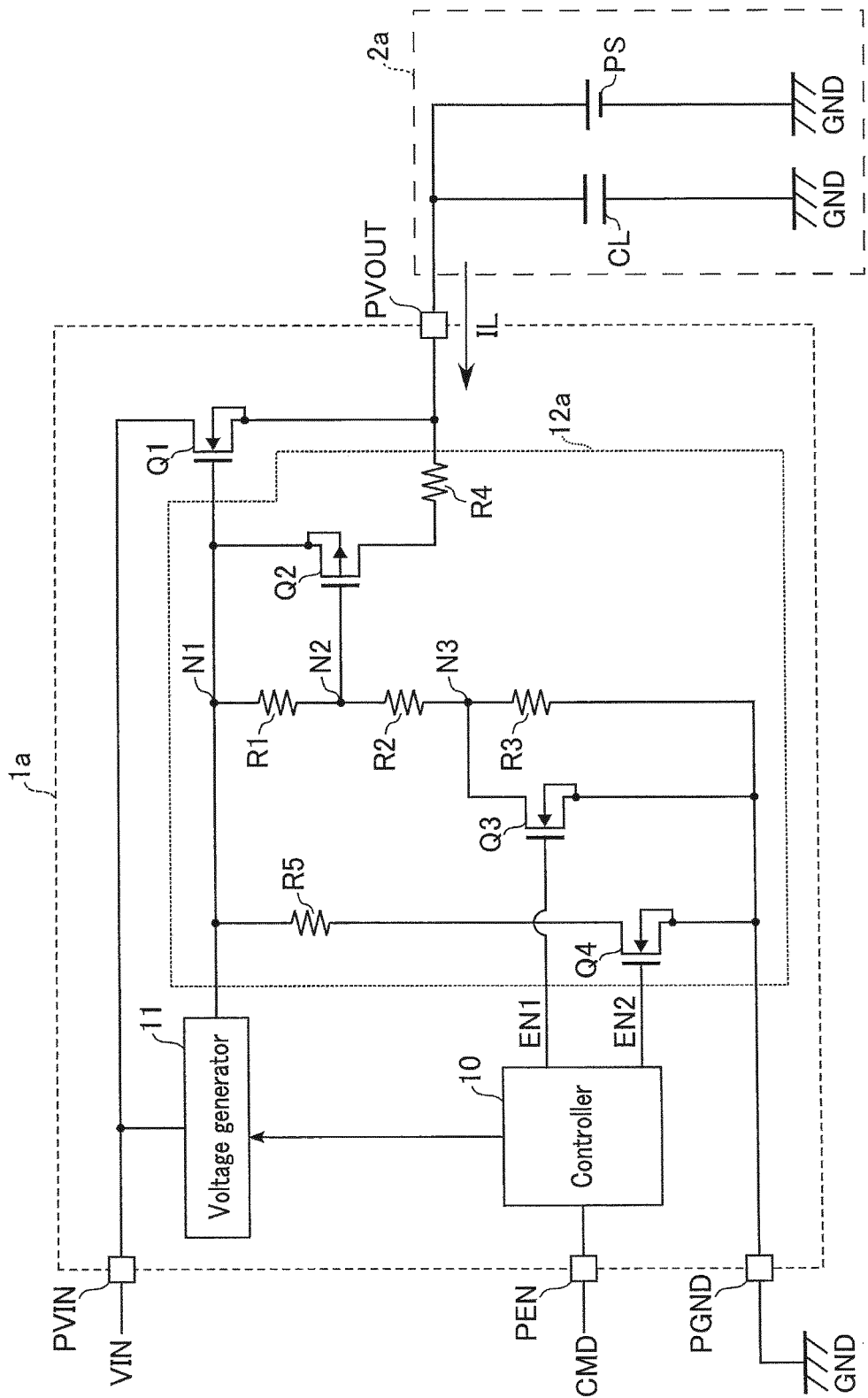
FIG. 3 is a circuit diagram for illustrating a configuration example of a semiconductor device according to the second embodiment and a configuration example of a load to which electric power is supplied by the semiconductor device.

FIG. 3 is a circuit diagram for illustrating a configuration example of a semiconductor device of the second embodiment and a configuration example of a load to which electric power is supplied by the semiconductor device. The semiconductor device 1a has a configuration in which the switching circuit 12 of the semiconductor device 1 described in connection with the first embodiment is replaced with a switching circuit 12a.

The switching circuit 12a further includes a resistance element R5 in addition to the configurations of the switching circuit 12. The resistance element R5 is provided between the node N1 and the drain of the switching element Q4. Specifically, one end of the resistance element R5 is coupled to the node N1. The other end of the resistance element R5 is coupled to the drain of the switching element Q4. In other words, the resistance element R5 and the switching element Q4 are coupled in series between the node N1 and the terminal PGND. The resistance value of the resistance element R5 is smaller than the resistance value of any of the resistance elements R1 to R3. Specifically, for example, the resistance value of the resistance element R5 is several kΩ. The other configurations of the switching circuit 12a are similar to those of the switching circuit 12.

Other than the configuration of the switching circuit 12a, the semiconductor device 1a is similar to the semiconductor device 1.

[2-1-2] Configuration of Load 2a

A description will be given of the load 2a with reference to FIG. 3. The second embodiment will be described, referring to an example in which the load 2a is coupled to the terminal PVOUT, which is the output terminal of the semiconductor device 1a. The load 2a has a configuration in which the resistance load RL of the load 2 described in connection with the first embodiment is replaced with a power source PS.

The power source PS is a constant voltage source that outputs a voltage VA. The voltage VA is, for example, a voltage having the same magnitude as the voltage VIN. The power source PS outputs the voltage VA to the terminal PVOUT. The other configurations are similar to those of the load 2.

Since the load 2a includes the power source PS, a current can flow from the power source PS to a node electrically coupled to the load 2a if the voltage of that node becomes lower than, the voltage VA. For example, when the semiconductor device 1a executes an off operation, a current flows to the switching circuit 12a from the power source PS. In the present embodiment, the current that flows from the power source PS to the semiconductor device 1a via the terminal PVOUT during the off operation of the semiconductor device 1a and that flows to the terminal PGND via the switching circuit 12a will be referred to as current IL. Since the current IL is a load on the Power source PS, such a current should be preferably suppressed.

If the magnitude of the gate-source voltage VGS(Q1) of the switching element Q1 becomes larger than the breakdown voltage VMAX(Q1), the switching element Q1 may be damaged. The on-resistance Ron(Q2) of the switching element Q2, the on-resistance Ron(Q4) of the switching element Q4, the resistance value r4 of the resistance element R4, the resistance value r5 of the resistance element R5, and the voltage VA are determined to satisfy the relationships expressed by the following formula (5)

$$VMAX(Q1) > ((r4+Ron(Q2)/(r4+Ron(Q2)+r5+Ron(Q4)) \times VA \quad (5)$$

[2-2] Operation

A description will now be given of how the semiconductor device 1a operates.

Figure 4:
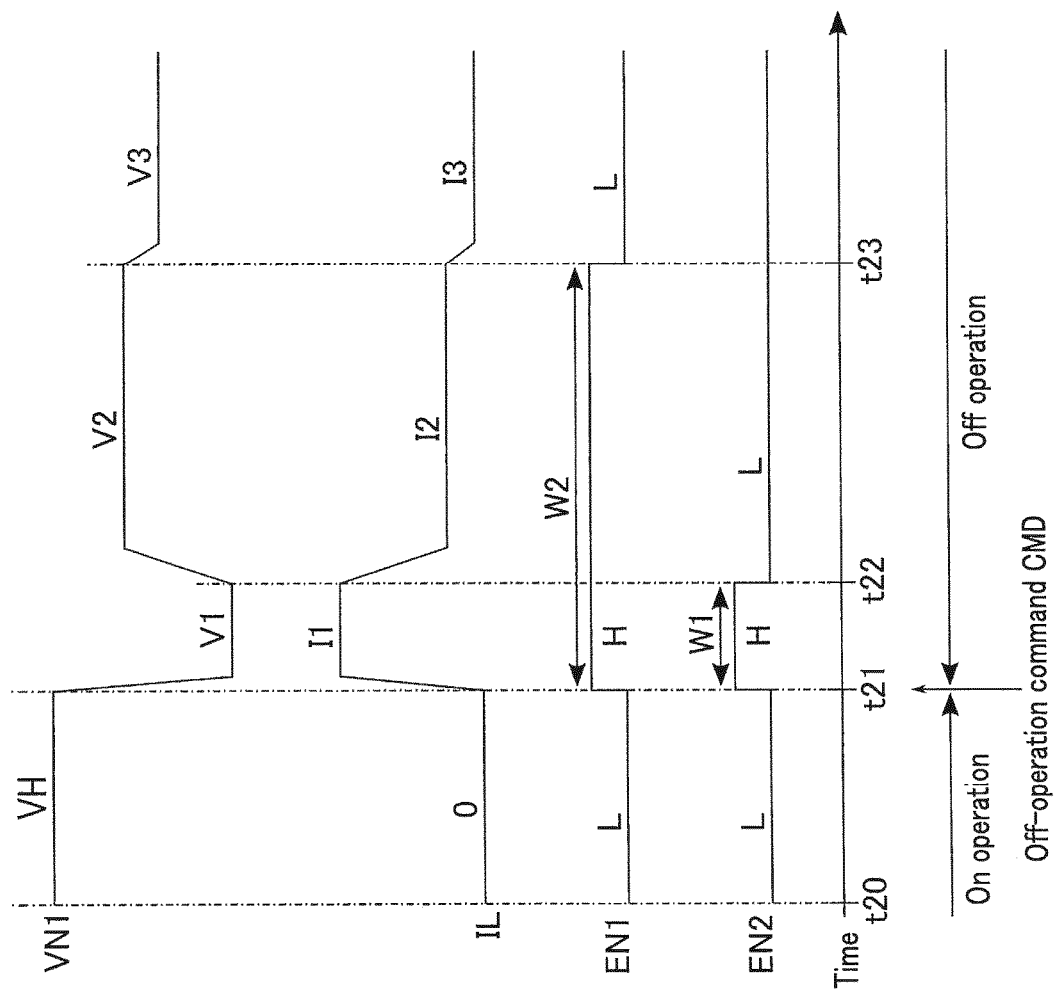
FIG. 4 is a timing chart showing an operation example of the semiconductor device of the second embodiment.

FIG. 4 is a timing chart showing an operation example of the semiconductor device of the second embodiment. FIG. 4 shows how the semiconductor device 1a executing the on operation executes the off operation in response to the reception of the off-operation command CMD. In FIG. 4, a voltage VN1 of the node N1, a voltage VOUT of the terminal PVOUT, a current IL flowing into the semiconductor device 1a from the terminal PVOUT, a signal EN1 and a signal EN2 are shown.

The on-operation of the semiconductor device 1a is similar to the on-operation of the semiconductor device 1 described in connection with the first embodiment. That is, the semiconductor device 1a that has received the on-operation command CMD executes the on operation, and the switching element Q1 is set to the on state and the switching elements Q2 to Q4 are set to the off state. The switching element Q1 in the on state supplies electric power to the load 2a.

At time t20, the semiconductor device 1a is executing the on operation. During the period from time t20 to time t21, the voltage VN1 is voltage VH. Since the voltage VN1 is larger than the voltage VA during the period from time t20 to time t21, the current IL flowing into the semiconductor device 1a is 0A. During the period from time t20 to time t21, the signals EN1 and EN2 maintain the L level.

At time t21, the semiconductor device 1a executes the off operation in response to the reception of the off operation command CMD. Specifically, upon reception of the off-operation command CMD, the controller 10 causes the voltage generator 11 to stop outputting the voltage VH. Further, the controller 10 outputs the H level signal EN1 and the H level signal EN2 to the switching circuit 12a.

In the switching circuit 12a, the switching element Q3 is turned on based on the H level signal EN1. As a result, the switching element Q2 is turned on. Thus, the voltage VN1 is discharged via the switching element Q2 in the on state and the resistance element R4 such that the magnitude of the gate-source voltage VGS(Q1) of the switching element Q1 decreases.

In the switching circuit 12a, the switching element Q4 is turned on based on the H level signal EN2. As a result, the node N1 and the terminal PGND are electrically coupled to each other by the resistance element R5 and the switching element Q4 in the on state. Thus, the voltage VN1 is discharged via the resistance element R5 and the switching element Q4 in the on state.

Since the voltage VN1 is discharged and the magnitude of the gate-source voltage VGS(Q1) of the switching element Q1 becomes lower than the threshold voltage Vth(Q1) of the switching element Q1, the switching element Q1 is turned off. The switching element Q1 in the off state does not supply electric power to the load 2a.

The load 2a includes the power source PS. Therefore, even if the supply of electric power from the semiconductor device 1a is cut off, the voltage VOUT of the terminal PVOUT is kept at the voltage VA.

Further, when the voltage VN1 is discharged and the voltage VN1 becomes lower than the voltage VA, a current flows from the terminal PVOUT to the node N1 via the resistance element R4 and the switching element Q2 in the on state. The current path from the node N1 to the ground voltage GND includes a current path that permits a current to flow to the terminal PGND via the resistance element R5 and the switching element Q4 in the on state, a current path that permits a current to flow to the terminal PGND via the resistance elements R1 and R2 and the switching element Q3 in the on state, and a current path that permits a current to flow to the terminal PGND via the resistance elements R1 to R3. The resistance values of the resistance elements R1 to R3 are larger than the resistance value of the resistance element R5. Therefore, the main current path from the node N1 to the ground voltage GND is a current path that passes the resistance element R5 and the switching element Q4 in the on state.

In this manner, a current flows to the node N1 via the resistance element R4 and the switching element Q2 in the on state, and the node N1 is discharged via the resistance element R5 and the switching element Q4 in the on state. Therefore, the voltage VN1 of the node N1 stabilizes at the voltage V1 that can be expressed by the following formula (6)

$$V1=((r5+Ron(Q4))/(r4+Ron(Q2)+r5+Ron(Q4)))\times VA \quad (6)$$

As described above, when the discharge of the voltage VN1 is started at time t21, the voltage VN1 drops to the voltage V1 and stabilizes at the voltage V1.

When the voltage VN1 is the voltage V1, the magnitude of the gate-source voltage VGS(Q1) of the switching element Q1 is determined by the following formula (7):

$$|VGS(Q1)|=VA-V1=((r4+Ron(Q2)/(r4+Ron(Q2)+r5+Ron(Q4)))\times VA \quad (7)$$

As should be clear from the above formulas (5) and (7), when the voltage VN1 is the voltage V1, the gate-source voltage VGS(Q1) of the switching element Q1 is lower than the breakdown voltage VMAX(Q1).

When the voltage VN1 is the voltage V1, the current IL that flows from the terminal PVOUT into the semiconductor device 1a along the main current path can be expressed as the current I1 expressed by the following formula (8)

$$I1=VA/(r4+Ron(Q2)+r5+Ron(Q4)) \quad (8)$$

As described above, when the discharge of the voltage VN1 is started at time t21, the current IL increases to the current I1 and stabilizes at the current I1.

At time t22, the controller 10 sets the signal EN2 to the L level. Time t22 corresponds to the timing when a first period W1 has elapsed from time t21 at which the controller 10 outputs the H level signal EN1 and the H level signal EN2 to the switching circuit 12a.

In the switching circuit 12a, the switching element Q4 is turned off based on the L level signal EN2.

Since the switching element Q4 is turned off, the main current path from the node N1 to the ground voltage is a current path that passes the resistance elements R1 and R2 and the switching element Q3 in the on state. That is, the current IL flowing into the semiconductor device 1a flows to the terminal PGND via the resistance element R4, the switching element Q4 in the on state, the resistance element R1, the resistance element R2, and the switching element Q3 in the on state.

Since the current path changes at time t22, the voltage VN1 increases and the current IL decreases. A description will be given of how each of the voltage VN1 and the current IL changes.

The resistance values of the resistance elements R1 and R2 are larger than any of the resistance value of the resistance element R4, the on-resistance of the switching element Q4, and the on-resistance of the switching element Q3. Therefore, the voltage VN1 rises to the voltage V2 that can be expressed by the formula (9) set forth below, and stabilizes at the voltage V2.

$$V2=VA \quad (9)$$

On the other hand, the current IL decreases to the current I2 which can be expressed by the formula (10) set forth below, and stabilizes at the current I1.

$$I2=VA/(r1+r2) \quad (10)$$

The denominator (r1+r2) of the formula (10) representing the current I2 is the sum of the high resistance values. The denominator (r4+Ron(Q2)+r5+Ron(Q4)) of the formula (8) representing the current I1 is smaller than the denominator (r1+r2) of the formula (10). Thus, the current I2 is smaller than the current I1.

At time t23, the controller 10 sets the signal EN1 to the L level. Time t23 corresponds to the timing when a second period W2 longer than the first period W1 has elapsed from time t21 at which the controller 10 outputs the H level signal EN1 and the H level signal EN2 to the switching circuit 12a.

In the switching circuit 12a, the switching element Q3 is turned off based on the L level signal EN1. As a result, the switching element Q2 is turned off.

Since the switching element Q3 is turned off, the main current path from the node N1 to the ground voltage GND is a current path that passes the resistance elements R1 to R3 coupled in series. The voltage VN1 is discharged and lowered by the resistance elements R1 to R3 coupled in series.

When the voltage VN1 is discharged and the difference between the voltage VN1 and the voltage VA becomes larger than the forward voltage VF(Q2) of the body diode of the switching element Q2, the body diode of the switching element Q2 is turned on. As a result, the current IL flowing into the semiconductor device 1a flows to the terminal PGND via the resistance element R4, the body diode of the switching element Q2, the resistance element R1, the resistance element R2, and the resistance element R3.

Since the current path changes at time t23, the voltage VN1 lowers and the current IL decreases. A description will be given of how each of the voltage VN1 and the current IL changes.

The resistance values of the resistance elements R1 to R3 are larger than either of the resistance value of the resistance element R4 and the parasitic resistance of the body diode of the switching element Q2. Therefore, the voltage VN1 drops to the voltage V3 that can be expressed by the formula (11) set forth below, and stabilizes at the voltage V3.

$$V3=VA-VF(Q2) \quad (11)$$

The current IL decreases to the current I3 that can be expressed by the formula (12) set forth below, and stabilizes at the current I3.

$$I3=((VA-VF(Q2))/(r1+r2+r3)) \quad (12)$$

As compared with the formula (10) representing the current I2, the numerator of the formula (12) representing the current I3 is smaller by VF (Q2) and the denominator thereof is larger by r3. Thus, the current I3 is smaller than the current I2.

In this manner, the semiconductor device 1a that has received the off-operation command CMD executes the off operation, and turns off the switching element Q1 by setting the signals EN1 and EN2 to the H level and turning on the switching elements Q2 to Q4. When the first period W1 elapses after the signals EN1 and EN2 are set to the H level, the semiconductor device 1a sets the signal EN2 to the L level. Further, the semiconductor device 1a sets the signal EN1 to the L level when the second period W2, which is longer than the first period W1, elapses after the signals EN1 and EN2 are set to the H level.

Where the load 2a including the power source PS is coupled to the semiconductor device 1a, the magnitude of the gate-source voltage VGS(Q1) of the switching element Q1 is kept lower than the breakdown voltage VMAX(Q1), as described above. Moreover, after the first period W1 and the second period W2 elapse, the magnitude of the current IL flowing from the terminal PVOUT becomes smaller than the magnitude of the current IL flowing during the first period and the second period.

Where the load 2 described in connection with the first embodiment is coupled to the semiconductor device 1a and when the semiconductor device 1a receives the off-operation command CMD, the voltage VN1 and the voltage VOUT are discharged to 0V within the first period W1. That is, where the load coupled to the terminal PVOUT is the load 2, the semiconductor device 1a of the second embodiment sets the voltage VN1 to 0V, as in the semiconductor device 1 of the first embodiment, and operates such that the gate-source voltage VGS(Q1) of the switching element Q1 is 0V or lower than 0V.

[2-3] Advantages

According to the semiconductor device 1a of the second embodiment described above, damage to the switching element Q1 can be suppressed in the off operation, and the current flowing from the terminal PVOUT can be suppressed. Detailed advantages of the semiconductor device 1a of the second embodiment will be described below.

The semiconductor device 1a of the second embodiment includes a resistance element R5. The resistance element R5 and the switching element Q4 are coupled in series between the node N1 and the terminal PGND.

With this configuration, the semiconductor device 1a of the second embodiment can suppress damage to the switching element Q1 in the off operation. Specifically, where the off operation is executed with the load including the power source PS being coupled to the terminal PVOUT, the current flowing to the node N1 is discharged via the resistance element R5 and the switching element Q4 in the on state. Since the current flowing to the node N1 is discharged via the resistance element R5, a voltage difference is generated between the ends of the resistance element R5. Thus, an increase in the difference between the voltage VN1 and the voltage VA can be suppressed, and the magnitude of the gate-source voltage VGS(Q1) of the switching element Q1 is prevented, from exceeding the breakdown voltage VMAX (Q1). Therefore, the semiconductor device 1a of the second embodiment can suppress damage to the switching element Q1 and improve operation reliability.

Further, the controller 10 of the semiconductor device 1a of the second embodiment changes the switching element Q4 from the on state to the off state when the first period W1 elapses from the time at which the switching elements Q3 and Q4 are changed from the off state to the on state. In addition, the controller 10 changes the switching element Q4 from the on state to the off state when the second period W2 longer than the first period W1 elapses from the time at which the switching elements Q3 and Q4 are changed from the off state to the on state.

Thus, the semiconductor device 1a of the second embodiment can suppress damage to the switching element Q1 in the off operation and can suppress the current flowing from the terminal PVOUT into the semiconductor device 1a.

In a state where the load including the power source PS is coupled to the terminal PVOUT, the amount of current IL is larger where the switching elements Q3 and Q4 are in the on state than where the switching elements Q3 and Q4 are in the off state. Since the semiconductor device 1a keeps the switching elements Q3 and Q4 in the off state in and after the second period W2 during the off operation, the current IL which may be used in and after the second period W2 can be suppressed. Therefore, the semiconductor device 1a of the second, embodiment can suppress the load on the power source where the coupled load includes the power source.

In the semiconductor device 1a, the second period W2 until the switching element Q4 is turned off is set to be equal to or longer than the first period W1 until the switching element Q3 is turned off. Thus, the switching element Q3 is kept in the on state while the switching element Q4 is in the on state.

Where the switching element Q4 is in the on state and the switching elements Q2 and Q3 are in the off state in the state where the load including the power source PS is coupled to the terminal PVOUT, the voltage VN1 becomes 0V and the voltage VOUT becomes the voltage VA, so that the magnitude of the gate-source voltage VGS(Q1) of the switching element Q1 can be large. In the semiconductor device 1a of the second embodiment, the switching element Q3 is kept in the on state while the switching element Q4 is in the on state, so that the resistance element R5 serves to prevent the gate-source voltage VGS(Q1) of the switching element Q1 from becoming large. Thus, the semiconductor device 1a of the second embodiment can suppress the current flowing from the terminal PVOUT into the semiconductor device 1a, and can suppress the damage to the switching element Q1.

[2-4] Other Operation Examples

FIG. 4 illustrates an example in which the second period W2 is longer than the first period W1. Since, in the second embodiment, the second period W2 may be equal to or longer than the first period W1, the second period W2 and the first period W1 can be made equal to each other. In the description below, the case where the second period W2 and the first period W1 are equal to each other will be described with reference to FIG. 5.

Figure 5:
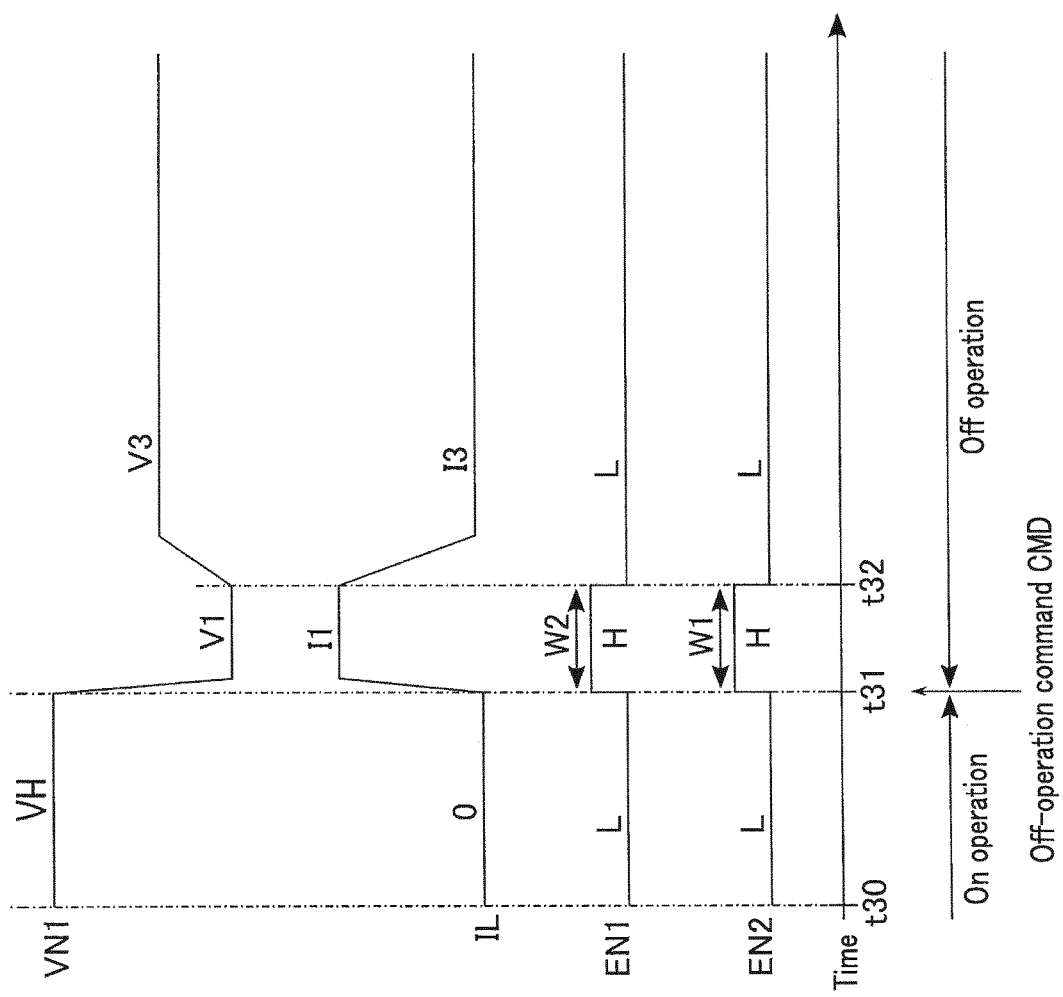
FIG. 5 is a timing chart showing another operation example of the semiconductor device of the second embodiment.

FIG. 5 is a timing chart showing another operation example of the semiconductor device of the second embodiment. FIG. 5 shows how the semiconductor device 1a executing the on operation executes the off operation in response to the reception of the off-operation command CMD. In FIG. 5, a voltage VN1 of the node N1, a voltage VOUT of the terminal PVOUT, a current IL flowing into the semiconductor device 1a from the terminal PVOUT, a signal EN1 and a signal EN2 are shown.

The operation example shown in FIG. 5 differs from the operation example shown in FIG. 4 in terms of the length of the second period W2. Times t30, t31 and t32 in FIG. 5 correspond to times t20, t21 and t22 in FIG. 4, respectively. The operation from time t30 to time t32 in FIG. 5 is similar to the operation from time t20 to time t22 in FIG. 4. The operation after time t32 in FIG. 5 differs from the operation after time t22 in FIG. 4.

During the period from time t30 to time t31, the semiconductor device 1a is executing the on operation. During the period from time t30 to time t31, the voltage VN1 is voltage VH. Since the voltage VN1 is larger than the voltage VA during the period from time t30 to time t31, the current flowing into the semiconductor device 1a is 0A. During the period from time t30 to time t31, the signals EN1 and EN2 maintain the L level.

At time t31, the semiconductor device 1a executes the off operation in response to the reception of the off operation command CMD. At time t31, the signals EN1 and EN2 have already changed from the L level to the H level. After time t31, the voltage VN1 drops to the voltage V1 and stabilizes at the voltage V1. After time t31, the current flowing from the terminal PVOUT increases to and stabilizes at the current I1.

At time t32, the controller 10 switches each of the signal EN1 and the signal EN2 to the L level. Time t32 corresponds to the timing when the first period W1 and the second period W2 equal in length to the first period W1 have elapsed from time t31 at which the controller 10 outputs the H level signal EN1 and the H level signal EN2 to the switching circuit 12a.

In the switching circuit 12a, the switching element Q3 is turned off based on the L level signal EN1. As a result, the switching element Q2 is turned off. Further, the switching element Q4 is turned off based on the L level signal EN2.

Thus, the current IL flowing into the semiconductor device 1a flows to the terminal PGND via the resistance element R4, the body diode of the switching element Q2, the resistance element R1, the resistance element R2, and the resistance element R3. After time t32, the voltage VN1 rises to the voltage V3 and stabilizes at the voltage V3. After time t32, the current IL decreases to the current I3 and stabilizes at the current I3.

As described above, the semiconductor device of the second embodiment can suppress damage to the switching element Q1 in the off operation and can, suppress the current flowing from the terminal PVOUT even where the second period W2 and the first period W1 are set to be equal to each other.

[3] Modifications

In connection with the above embodiments, reference was made to an example in which the semiconductor device functioning as a load switch is configured in one IC chip. The load switch may be configured by combining a plurality of components, such as an IC chip of a gate driver and a package of switching elements. FIG. 6 is a circuit diagram for illustrating a configuration example of a semiconductor device according to a modification and a configuration example of a load to which electric power is supplied by the semiconductor device. The semiconductor device 1b is a load switch that enables supply of electric power to the load 2. The semiconductor device 1b includes a semiconductor device 100 and a switching element Q1a.

The semiconductor device 100 is a gate driver that drives the gate of the switching element Q1a. The semiconductor device 100 is, for example, an IC chip. The semiconductor device 100 differs from the semiconductor device 1 of the first embodiment in that the switching element Q1 is not included and a terminal PVGATE is further included. The terminal PVGATE is an output terminal of the semiconductor device 100. The terminal PVGATE is coupled to the node N1. Other configurations of the semiconductor device 100 are similar to those of the semiconductor device 1 described in connection with the first embodiment.

The switching element Q1a is an N-channel MOSFET. The switching element Q1a is, for example, a semiconductor element included in a package that is independent of the semiconductor device 100. The drain of the switching element Q1a is coupled to the terminal PVIN. The source of the switching element Q1a is coupled to the terminal PVOUT. The gate of the switching element Q1a is coupled to the terminal PVGATE.

As described above, even where the load switch is configured by combining a plurality of components, the advantages similar to those of the above embodiments can be obtained.

In connection with the above embodiments, reference was made to the case where the loads to which the semiconductor device supplies electric power include a capacity load and a resistance load, and to the case where the loads include a capacity load and a power source. The configuration of a load to which the semiconductor device supplies electric power is not limited to the examples shown in the above embodiments. The load to which the semiconductor device supplies electric power may be, for example, an information processing terminal such as a personal computer or a smartphone, or a charging device of a battery.

In the present specification, the "first end of a switching element" corresponds to the source or drain of a MOSFET. The "second end of the switching element" corresponds to the drain or source of the MOSFET.

In the present specification, the expression that voltages are substantially equal means that the voltages can be regarded as being equal even if there is a slight voltage difference due to the influence of the on-resistance of a transistor, a leakage current, a resistance component of wiring, etc.

In the present specification, the term "coupling" means that elements are electrically coupled and does not exclude the case where another element is interposed in between. In addition, "electrically coupling" may use an insulator as long as the insulator does not affect the proper operation accomplished by the electrical coupling. In the specification, the "on state" indicates that a voltage equal to or higher than the threshold voltage of a transistor is applied to the gate of the transistor. The "off state" indicates that a voltage lower than the threshold voltage of the transistor is applied to the gate of the transistor, and does not exclude a case where a minute current such as a leakage current of a transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first terminal;
a second terminal;
a first circuit; and
a second circuit, wherein
the first circuit includes a first switching element, a second switching element, and a first resistor, the first switching element includes a first end, a second end and a gate, the first end of the first switching element is coupled to a first node to which a first voltage is supplied, the second end of the first switching element is coupled to the first terminal, and the gate of the first switching element is coupled between the first node and the second terminal,
the first resistor and the second switching element are coupled in series between the first node and the second terminal,
the first circuit is configured to change the first switching element and the second switching element from an off state to an on state when supply of the first voltage to the first node is stopped, the first circuit further includes a second resistor, a third resistor, a fourth resistor, and a third switching element, one end of the second resistor is coupled to the first node, one end of the third resistor is coupled to another end of the second resistor and the gate of the first switching element, one end of the fourth resistor is coupled to the second terminal, the third switching element includes a first end and a second end, the first end of the third switching element is coupled to the second terminal, and the second end of the third switching element is coupled to another end of the third resistor and another end of the fourth resistor, and the second circuit is configured to change the second switching element and the third switching element from an off state to an on state when supply of the first voltage to the first node is stopped.

2. The device of claim 1, wherein
the second circuit is configured to:
change the second switching element from the on state to the off state when a first period elapses from a time when the second switching element and the third switching element are changed from the off state to the on state, and
change the third switching element from the on state to the off state when a second period longer than the first period elapses from the time at which the second switching element and the third switching element are changed from the off state to the on state.

3. The device of claim 2, wherein
the second circuit is configured to:
change the second switching element and the third switching element from the off state to the on state by changing a voltage at a gate of the second switching element and a voltage at a gate of the third switching element from a first logic level to a second logic level,
change a voltage at the gate of the second switching element from the second logic level to the first logic level when the first period elapses from the time at which the second switching element and the third switching element are changed from the off state to the on state, and
change a voltage at the gate of the third switching element from the second logic level to the first logic level when the second period elapses from the time at which the second switching element and the third switching element are changed from the off state to the on state.

4. The device of claim 1, wherein
the first switching element is a P-channel MOSFET, and
each of the second switching element and the third switching element is an N-channel MOSFET.

5. The device of claim 1, further comprising:
a third circuit configured to generate the first voltage and output the generated first voltage to the first node, wherein
the second circuit instructs the third circuit to stop output of the first voltage.

6. The device of claim 1, further comprising:
a third terminal to which a second voltage is supplied from outside of the semiconductor device, and
a fourth switching element including a first end, a second end, and a gate, the first end of the fourth switching element is coupled to the first terminal, the second end of the fourth switching element is coupled to the third terminal, and the gate of the fourth switching element is coupled to the first node.

7. The device of claim 6, wherein
the first voltage is higher than the second voltage, and
the fourth switching element is an N-channel MOSFET.

8. The device of claim 1, further comprising:
a fourth terminal coupled to the first node.

* * * * *